United States Patent
Nakamura et al.

(10) Patent No.: US 7,166,869 B2
(45) Date of Patent: *Jan. 23, 2007

(54) NITRIDE SEMICONDUCTOR WITH ACTIVE LAYER OF QUANTUM WELL STRUCTURE WITH INDIUM-CONTAINING NITRIDE SEMICONDUCTOR

(75) Inventors: Shuji Nakamura, Tokushima (JP); Shinichi Nagahama, Tokushima (JP); Naruhito Iwasa, Komatsushima (JP)

(73) Assignee: Nichia Corporation, Tokushima (JP)

( * ) Notice: Subject to any disclaimer, the term of this patent is extended or adjusted under 35 U.S.C. 154(b) by 221 days.

This patent is subject to a terminal disclaimer.

(21) Appl. No.: 10/801,038

(22) Filed: Mar. 16, 2004

(65) Prior Publication Data

US 2004/0183063 A1 Sep. 23, 2004

Related U.S. Application Data

(60) Continuation of application No. 10/229,067, filed on Aug. 28, 2002, now abandoned, which is a continuation of application No. 09/293,060, filed on Apr. 25, 2000, now abandoned, which is a division of application No. 08/743,729, filed on Nov. 6, 1996, now Pat. No. 5,959,307.

(30) Foreign Application Priority Data

| Nov. 6, 1995 | (JP) | 7-287189 |
| Nov. 24, 1995 | (JP) | 7-305279 |
| Nov. 24, 1995 | (JP) | 7-305280 |
| Nov. 24, 1995 | (JP) | 7-305281 |
| Dec. 6, 1995 | (JP) | 7-317850 |
| Dec. 20, 1995 | (JP) | 7-332056 |
| Jul. 16, 1996 | (JP) | 8-186339 |
| Aug. 29, 1996 | (JP) | 8-228147 |

(51) Int. Cl.
*H01L 27/15* (2006.01)
*H01L 31/12* (2006.01)

(52) U.S. Cl. .......................... 257/85; 257/94

(58) Field of Classification Search ................ 257/14, 257/85, 94, 196, 201, 615
See application file for complete search history.

(56) References Cited

U.S. PATENT DOCUMENTS 4,862,471 A 8/1989 Pankove ...................... 372/45

(Continued)

FOREIGN PATENT DOCUMENTS

EP 0 675 552 A1 10/1995

(Continued)

OTHER PUBLICATIONS

Narukawa et al Phys. Rev. B vol. 55, No. 4, pp. R1938-1941-1/97 Recombination dynamics of localized excitons in $In_{0.20}Ga_{0.80}N$-$In_{0.05}Ga_{0.95}N$ multiple quantum wells.

(Continued)

*Primary Examiner*—Theresa T. Doan
(74) *Attorney, Agent, or Firm*—Nixon & Vanderhye P.C.

(57) ABSTRACT

A nitride semiconductor device has a nitride semiconductor layer structure. The structure includes an active layer of a quantum well structure containing an indium-containing nitride semiconductor. A first nitride semiconductor layer having a band gap energy larger than that of the active layer is provided in contact with the active layer. A second nitride semiconductor layer having a band gap energy smaller than that of the first layer is provided over the first layer. Further, a third nitride semiconductor layer having a band gap energy larger than that of the second layer is provided over the second layer.

9 Claims, 3 Drawing Sheets

U.S. PATENT DOCUMENTS

| | | | |
|---|---|---|---|
| 5,247,533 A | 9/1993 | Okazaki et al. | 372/42 |
| 5,294,833 A * | 3/1994 | Schetzina | 257/741 |
| 5,412,226 A | 5/1995 | Rejman-Greene et al. | 257/21 |
| 5,475,700 A | 12/1995 | Iwata | 372/45 |
| 5,557,115 A | 9/1996 | Shakuda | 257/81 |
| 5,578,839 A | 11/1996 | Nakamura et al. | |
| 5,602,418 A | 2/1997 | Imai et al. | |
| 5,625,202 A | 4/1997 | Chai | 257/81 |
| 5,642,376 A | 6/1997 | Olbright et al. | 372/45 |
| 5,646,953 A | 7/1997 | Naito et al. | 372/46 |
| 5,656,832 A | 8/1997 | Ohba et al. | |
| 5,670,798 A * | 9/1997 | Schetzina | 257/96 |
| 5,679,965 A | 10/1997 | Schetzina | 257/103 |
| 5,684,309 A | 11/1997 | McIntosh et al. | 257/14 |
| 5,689,123 A | 11/1997 | Major et al. | 257/190 |
| 5,693,963 A | 12/1997 | Fujimoto et al. | 257/94 |
| 5,739,554 A | 4/1998 | Edmond et al. | 257/103 |
| 5,751,013 A | 5/1998 | Kidoguchi et al. | 257/13 |
| 5,789,876 A | 8/1998 | Umstadter et al. | |
| 5,793,054 A | 8/1998 | Nido | |
| 5,825,052 A | 10/1998 | Shakuda | |
| 5,838,029 A | 11/1998 | Shakuda | |
| 5,959,307 A * | 9/1999 | Nakamura et al. | 257/14 |
| 6,005,258 A | 12/1999 | Manabe et al. | 257/13 |
| 6,121,638 A | 9/2000 | Rennie et al. | 257/103 |
| 2004/0183063 A1 | 9/2004 | Nakamura et al. | |

FOREIGN PATENT DOCUMENTS

| | | |
|---|---|---|
| EP | 805500 A1 | 11/1997 |
| JP | 61-15385 | 1/1986 |
| JP | 61-156788 | 7/1986 |
| JP | 3-290984 | 4/1990 |
| JP | 4-68579 | 3/1992 |
| JP | 4-218994 | 8/1992 |
| JP | 4-242985 | 8/1992 |
| JP | 6-21511 | 1/1994 |
| JP | 6-164055 | 6/1994 |
| JP | 6-164085 | 6/1994 |
| JP | 6-177423 | 6/1994 |
| JP | 6-268257. | 6/1994 |
| JP | 6-232451 | 8/1994 |
| JP | 6-237039 | 8/1994 |
| JP | 6-268257 | 9/1994 |
| JP | 6-268259 | 9/1994 |
| JP | 7-074431 | 3/1995 |
| JP | 7-235723 | 9/1995 |
| JP | 7-235729 | 9/1995 |
| JP | 7-249795 | 9/1995 |
| JP | 7-297447 | 11/1995 |
| JP | 8-064910 | 3/1996 |
| JP | 8-070139 | 3/1996 |
| JP | 8-116128 | 5/1996 |
| JP | 08/290218 | 10/1996 |
| JP | 8-293643 | 11/1996 |
| JP | 8-316581 | 11/1996 |
| JP | 9-008412 | 1/1997 |
| JP | 9-64419 | 3/1997 |
| JP | 9-116225 | 5/1997 |
| JP | 9-129925 | 5/1997 |
| JP | 9-129929 | 5/1997 |
| JP | 9-148247 | 6/1997 |
| JP | 9-148678 | 6/1997 |
| JP | 9-191160 | 7/1997 |

OTHER PUBLICATIONS

Narukawa et al Appl. Phys. Lett. 70 (8), pp. 981-983, Feb. 1997 Role of self-formed InGaN quantum dots for exciton localization in the purple laser diode emitting at 420 nm.

Narukawa et al Appl. Phys. Lett., vol. 74, No. 4 pp. 558-560 1/99 Radioactive and nonradiative recombination processes in ultraviolet light-emitting diode composed of an $In_{0.02}Ga_{0.98}N$.

Nakamura et al Jpn. J. Appl. Phys., vol. 35, pp. L74-L76, Part 2, No. 1B, 1/96 InGaN-Based Multi-Quantum-Well Structure Laser Diodes.

Nakamura et al Jpn. J. Appl. Phys., vol. 35 (1996), pp. L217-220, Part 2, No. 2B, 2/96 InGaN Multi-Quantum-Well Structure Laser Diodes with Cleved Mirror Cavity Facets.

Nakamura et al Appl. Phys. Lett. 69 (11), pp. 1568-1570, 9/96 Optical gain and carrier lifetime of InGaN multi-quantum well structure laser diodes.

Jpn J. Appl. Phys. vol. 34 (1995) pp. L1332-L1335, Part 2, No. 10B, Oct. 15, 1995, "Superbright Green InGaN Single-Quantum-WII-Structure Light-Emitting Diodes".

Technical Report of IEICE, ED96-100, CPM96-78 (Oct. 1996), pp. 15-21.

Technical Report of IEICE, ED96-110, CPM96-88 (Oct. 1996), pp. 81-88.

Appl. Phys. Lett., 38 (11) Jun. 1981 pp. 835-837.

Akasaki et al., "Stimulated Emission by Current Injection from an AlGaN/GaN/GaInN Quantum Well Device," Jpn. J. Appl. Phys., vol. 34 (1995), pp. L1517-L1519.

Nakamura et al., "High-power InGaN Single-Quantum-Well-Structure Blue and Violet Light-Emitting Diodes," Appl. Phys. Lett., vol. 67, No. 67, No. 13 (1995), pp. 1868-1870.

Nakamura et al., "Candela-Class High-Brightness InGaN/AlGaN Double-Heterostructure Blue-Light-Emitting Diodes," Appl. Phys. Lett. vol. 63, No. 13 (1994), pp. 1687-1689.

Narukawa et al., "Recombination Dynamics of InGaN Quantum Wells by Time-Resolved Photoluminescence," Technical Report of the Institute of Electronics, Information and Communication Engineers (Oct. 1996) (Japan), pp. 81-88.

Wakahara et al., "Growth of GaInN Alloy Layer and Its Composition Inhomogeneity," Technical Report of the Institute of Electronics, Information and Communication Engineers (Oct. 1996) (Japan), pp. 15-20.

Nakamori, T., "Unveiling the Structure of Pulse-Oscillate GaN Blue-Violet Semiconductor Laser," Nikkei Electronics (Jan. 1996) (Japan) No. 653, pp. 13-15.

Nakamura, S., "Development of Blue Device in Final Stage," Electronics (Feb. 1996) (Japan), pp. 1-3.

Nakamura, S., "Latest Progress in Nitride-Based Blue/Green LED and Semiconductor Laser," International Forum "Blue Light-Emission" Project of Hoso-Bunka Foundation, Inc. (May 1996) (Japan) pp. 53-60.

Computer English Translation of JP 9-64419 (Mar. 1997) together w/Abstract (12 pgs.).

Computer English Translation of JP 8-293643 (Nov. 1996) together w/Abstract (15 pgs.).

Computer English Translation of JP 7-249795 (Sep. 1995) together w/Abstract (14 pgs.).

Kuga et al., "Violet and Near-UV Light Emission from GaN//$Al_{0.08}Ga_{0.92}N$ Injection Diode Grown on (0001) 6H-SiC Substrate by Low-Pressure Metal-Organic Vapor Phase Epitaxy," Jpn. J. Appl. Phys., vol. 34, Part 1, No. 8A (1995), pp. 4085-4086.

* cited by examiner

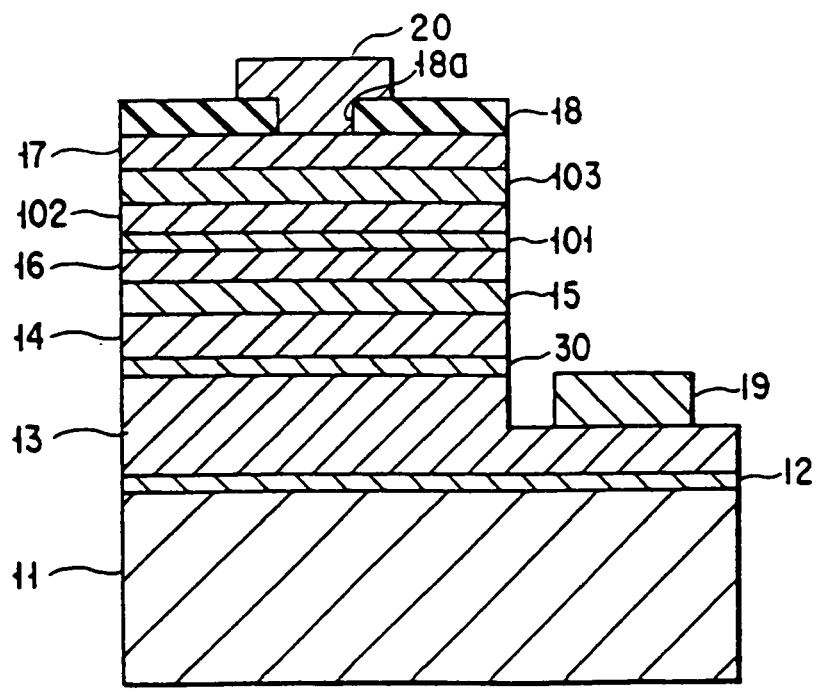
F I G. 2

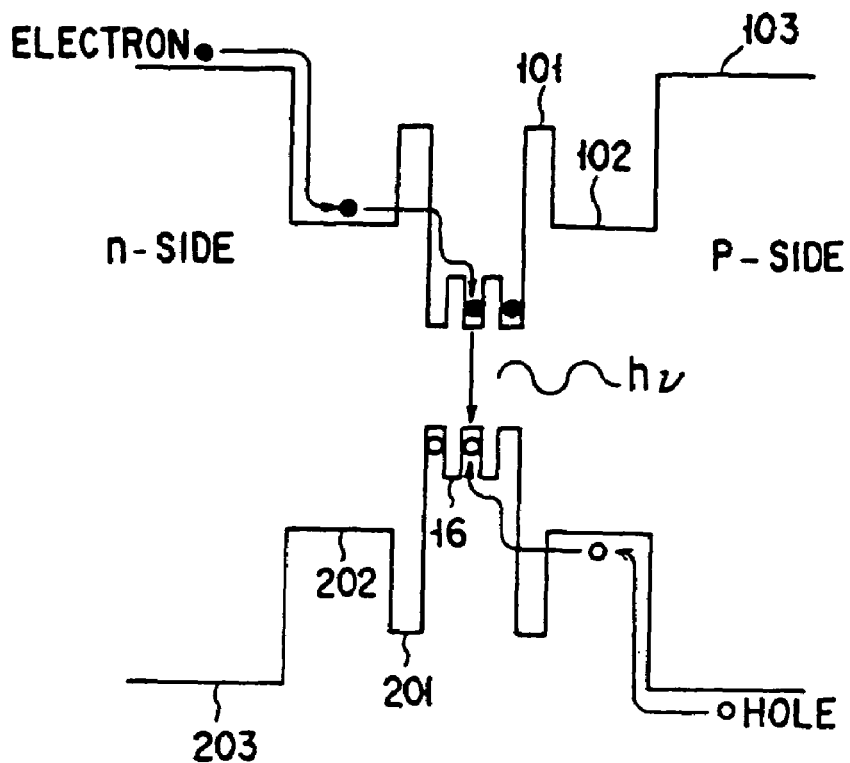
F I G. 5
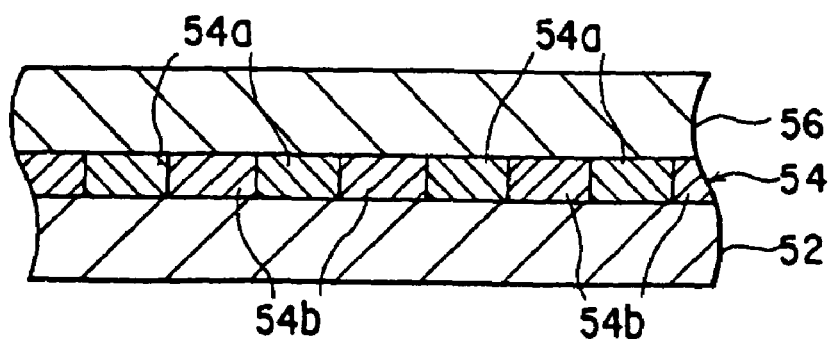
F I G. 6

NITRIDE SEMICONDUCTOR WITH ACTIVE LAYER OF QUANTUM WELL STRUCTURE WITH INDIUM-CONTAINING NITRIDE SEMICONDUCTOR

This application is a continuation of application Ser. No. 10/229,067, filed Aug. 28, 2002 now abandoned, which in turn is a continuation of application Ser. No. 09/293,060, filed Apr. 25, 2000 (now abandoned), which in turn is a division of application Ser. No. 08/743,729 filed Nov. 6, 1996, now U.S. Pat. No. 5,959,307.

BACKGROUND OF THE INVENTION

1. Field of the Invention

The present invention relates to a nitride semiconductor device including a light-emitting device, such as a laser diode (LD) device or a light-emitting diode (LED), and a light receiving device such as a solar cell, and more particularly to a nitride semiconductor light-emitting device.

2. Description of the Related Art

Nitride semiconductors can have a band gap energy which ranges from 1.95 to 6.0 eV depending on their composition, and hence they have been drawing attention as a material for such semiconductor light-emitting devices as a light-emitting diode (LED) device and a laser diode (LD) device. Recently, as a result of the utilization of these nitride semiconductor materials, a high-brightness blue LED device and green LED device have been put to practical use. These LED devices have a double-heterostructure having a p-n junction and both have an output power exceeding 1 mW.

A conventional LED device basically has a double-heterostructure wherein an active layer comprising InGaN is sandwiched between n-type and p-type clad layers each comprising AlGaN. An n-type contact layer comprising GaN is formed on the n-type clad layer, and a p-type contact layer comprising GaN is formed on the p-type clad layer. This laminate structure is formed on a substrate made of, for example, sapphire.

Basically, an LD device can have a structure similar to that of the above-mentioned LED device. However, most of LD devices have a separate confinement structure in which light and carrier are separately confined. A nitride semiconductor LD device of the separate confinement structure is disclosed in, for example, Japanese Patent Application Laid-Open (JP-A) No. 6-21511. This document shows a light-emitting device of the separate confinement structure in which an InGaN active layer is sandwiched between two light-guiding layers, i.e., n-type GaN and p-type GaN guiding layers. A carrier confinement layer of an n-type AlGaN is formed on the n-type light-guiding layer and another carrier confinement layer of a p-type AlGaN is formed on the p-type light-guiding layer.

Meanwhile, a semiconductor device of a conventional double-heterostructure has an active layer, a first clad layer which is formed in contact with the active layer and which has a larger band gap energy than that of the active layer, and a second clad layer which is formed in contact with the first clad layer and which has a larger band gap energy than that of the first clad layer. This structure is intended for an efficient injection of electrons and holes into the active layer in accordance with energy levels.

Likewise, a conventional nitride semiconductor LD device has an active layer and clad layers disposed thereon which include, for example, a light-guiding layer adjoined by a carrier confinement layer (light confinement layer), each having a progressively increased band gap energy (see, for example, the aforementioned laid-open application).

However, it has been found that a conventional nitride semiconductor device having an indium-containing active layer, and particularly an LD device, of the structure mentioned above, has a low-level light-emitting efficiency. In particular, it has been found that the rise in the device temperature by increasing the current supplied to the device is associated with a serious decrease in the light-emitting efficiency.

SUMMARY OF THE INVENTION

Accordingly, an object of the present invention is to provide a nitride semiconductor device having an active layer comprising an indium-containing nitride semiconductor, wherein the nitride semiconductor device has a high-level light-emitting efficiency.

Another object of the present invention is to provide a nitride semiconductor device which exhibits only slight reduction in the light-emitting efficiency even when the device temperature is raised.

In one aspect, the present invention provides a nitride semiconductor device comprising:

an active layer of a quantum well structure which has first and second surfaces and which comprises an indium-containing nitride semiconductor;

a first nitride semiconductor layer which is provided in contact with the first surface of the active layer and has a band gap energy larger than that of the active layer;

a second nitride semiconductor layer which is provided on the first surface side of the active layer at a location more distant from the active layer than the first nitride semiconductor layer and which has a band gap energy smaller than that of the first nitride semiconductor layer, and a third nitride semiconductor layer which is provided on the first surface side of the active layer at a location more distant from the active layer than the second nitride semiconductor layer and which has a band gap energy larger than that of the second nitride semiconductor layer.

In a second aspect, the present invention provides a nitride semiconductor device comprising:

a first clad layer comprising an n-type nitride semiconductor;

an active layer of a quantum well structure provided on the first clad layer, said active layer comprising a nitride semiconductor containing indium and gallium and having at least one well layer having a thickness not greater than 70 angstroms, wherein said well layer is placed on an underlying layer in a state lattice-mismatched with the underlying layer and includes a plurality of indium-rich regions and indium-poor regions; and a second clad layer which is provided on the active layer and comprises a nitride semiconductor doped with an acceptor impurity.

In a third aspect, the present invention provides a nitride semiconductor device comprising a first n-type layer which comprises an n-type, aluminum-containing nitride semiconductor or n-type gallium nitride, and a second n-type layer which comprises an n-type, aluminum-containing nitride semiconductor, wherein the device has a third n-type layer which comprises an n-type, indium-containing nitride semiconductor and which is provided between the first n-type layer and the second n-type layer.

In the nitride semiconductor device of the present invention, the active layer is sandwiched between a layer structure which eventually contacts with a positive electrode, and a layer structure which eventually contacts with a negative electrode. Hereinbelow, the side where a layer structure is provided which eventually contacts with a positive electrode is sometimes referred to as p-side, and the side where a layer structure is provided which eventually contacts with a negative electrode is sometimes referred to as n-side.

Further, in the present invention, a nitride semiconductor in a broad sense means a nitride of a Group III element or elements of the Periodic Table, and more specifically a nitride semiconductor represented by $In_xAl_yGa_{1-x-y}N$, where $0 \leq x \leq 1$, $0 \leq y \leq 1$, and $0 \leq x+y \leq 1$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a sectional view schematically illustrating an LD device according to a first embodiment of the present invention;

FIG. 5 illustrates energy bands corresponding to the device structure of FIG. 4; and FIG. 6 is a sectional view schematically illustrating an LD device according to a fourth embodiment of the present invention.

DETAILED DESCRIPTION OF THE PREFERRED EMBODIMENTS

The present inventors have examined the phenomenon of the reduction in the light-emitting efficiency which is associated with the rise in temperature of a nitride semiconductor device having an indium-containing active layer. As a result, they have found that such reduction in the light-emitting efficiency is primarily caused by the fact that an indium-containing nitride semiconductor, particularly InGaN, is more difficult to grow in comparison with an aluminum-containing nitride semiconductor or gallium nitride (GaN). That is, the decomposition temperatures of InN and GaN, which constitute InGaN, largely differ from each other, and thus InGaN tends to be subjected to phase-separation into InN and GaN. Therefore, an increase in indium content makes it difficult to obtain an active layer having a uniform composition. For these reasons, the content of indium in an InGaN semiconductor that forms an active layer tends to be suppressed to a low level in a conventional semiconductor device.

Figure 1:
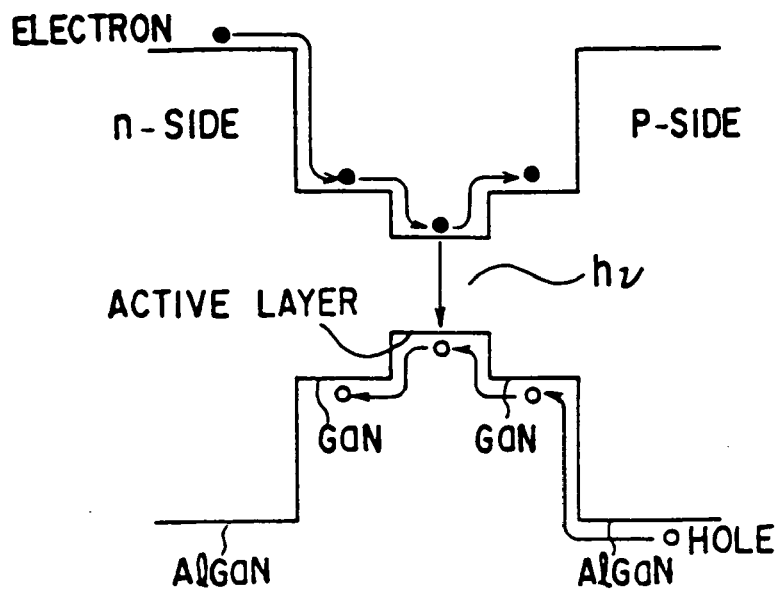
FIG. 1 illustrates energy bands corresponding to the layer structure of a conventional LD device.

In the case where a light-guiding layer of GaN is formed in contact with the InGaN active layer having such a low indium content, the band offset between the active layer and the guiding layer becomes extremely small. This will be explained with reference to FIG. 1 which illustrates energy bands corresponding to a conventional nitride semiconductor light-emitting device. As illustrated in FIG. 1, in the case of a conventional nitride semiconductor device, the band gap energy of the light-guiding layers (GaN) that directly sandwich InGaN active layer is not so large relative to the band gap energy of the active layer (InGaN) (because of the low In content of InGaN, the InGaN composition approaches GaN). Because of this, when the applied current is increased and the device temperature rises, before the electrons and the holes, which are injected into the active layer from the n-type layer and the p-type layer, respectively, recombine to emit light (hυ), the thermal energy causes the electrons and the holes to overflow the active layer to reach, respectively, the guiding layers (GaN) located on a side opposite to the side of the injection, that is, the electrons reach the p-type light-guiding layer and the holes reach the n-type light-guiding layer. As a result, the light-emitting efficiency is low and particularly the efficiency decreases as the temperature rises.

Therefore, in the nitride semiconductor device of the present invention, two first layers (the first p-side layer and the first n-side layer), which are provided to adjoin and sandwich an active layer comprising an indium-containing nitride semiconductor, are made of a nitride semiconductor having a larger band gap energy than that of the active layer. Preferably, the two first layers have a band gap energy which is larger than that of the active layer by 0.01–4.05 eV. Because of the presence of the first layers having such a large band gap energy, the electrons or holes, which are injected into the active layer, do not overflow the active layer. On each of the first layers, there is provided a second layer (a second p-side layer or a second n-side layer) which is preferably provided to adjoin the first layer. The second layers have each a band gap energy smaller than that of the first layer, but preferably larger than that of the active layer. Preferably, the second layers have a band gap energy which is smaller than the first layer by 0.01–4.05 eV. On each of the second layers, there is provided a third layer (a third p-side layer or a third n-side layer) which is preferably formed to adjoin the second layer. The third layers have each a band gap energy larger than that of the second layer. Preferably, the third layers have a band gap energy which is larger than that of the second layer by 0.01–4.05 eV. The electrons or holes which are injected from the third layer side will be effectively injected into the second layers having a smaller band gap energy but are unlikely to be injected into the active layer because of the larger band gap energy of the first layers. In the present invention, it is therefore preferable that the first layer has a thickness sufficiently thin so that the electrons or holes, i.e., carriers, can pass therethrough due to a tunneling effect (tunneling). Thus, the electrons or holes will be effectively injected from the third layers into the active layer. As a result, in the device of the present invention, the electrons or holes will be effectively injected from the third layers into the active layer and will not overflow the active layer because they are blocked by the first layers present on a side opposite to the side of the injection, even if the device temperature rises.

As will be apparent from the above description, the three-layer structure, comprising the first, second and third layers, can prevent the overflow of the carriers, i.e., the electrons or holes, if the three-layer structure is provided on one of the p- and n-sides of the active layer. Most preferably, the three-layer structure is provided on both sides (p-side and n-side) of the active layer.

The present invention will now be explained with reference to FIGS. 2 to 6. Throughout these Figures, the same elements or members are indicated with the same reference numerals.

FIG. 2 is a sectional view schematically illustrating an LD device according to a first embodiment of the present invention. In this LD device, the three-layer structure of the present invention is provided on the p-side of an active layer.

The LD device of FIG. 2 has a nitride semiconductor laminate structure on a substrate 11 through a buffer layer 12. The laminate structure includes an n-type contact layer 13 on the buffer layer 12, an n-type carrier confinement layer (light confinement layer) 14, an n-type light-guiding layer 15, an active layer 16, a first p-side nitride semiconductor layer 101 having a band gap energy larger than that of the active layer 16, a second p-side nitride semiconductor layer 102 having a band gap energy smaller than that of the first p-side nitride semiconductor layer, a third p-side nitride semiconductor layer 103 having a band gap energy larger than that of the second p-side nitride semiconductor layer 102, and a p-type contact layer 17. A current-restricting layer 18, which has a contact hole 18a therein, is provided on the p-type contact layer 17. A negative electrode 19 is provided on the exposed surface of the n-type contact layer 13, while a positive electrode 20 is provided on the current-restricting layer 18. The positive electrode 20 contacts with the p-type contact layer 17 through the contact hole 18a of the current-restricting layer 18.

The substrate 11 may be made of any ordinary material suitable for growing nitride semiconductors thereon, including spinel ($MgAl_2O_4$), sapphire ($Al_2O_3$, including A, R and C surfaces), SiC (including 6H, 4H and 3C), ZnS, ZnO, GaAs and GaN.

The buffer layer 12 can be formed of AlN, GaN, AlGaN or the like. It can be formed at a temperature not higher than 900° C. to have a thickness in the range of tens of angstroms to hundreds of angstroms. The buffer layer is formed in order to alleviate the lattice mismatch between the substrate 11 and an nitride semiconductor layer to be formed thereon. Therefore, the buffer layer 12 may be omitted in the case where a substrate is used which has a lattice matched with that of the nitride semiconductor or in the case where a substrate is used which has a lattice constant approximate to that of the nitride semiconductor or otherwise depending on the method of growing the nitride semiconductor.

The n-type contact layer 13 is formed of a nitride semiconductor, and preferably of GaN or $In_aGa_{1-a}N$ (0<a<1). (In this specification, a nitride semiconductor represented by $In_aGa_{1-a}N$ (0<a<1) or a similar expression is sometimes referred to simply as InGaN.) The use of Si-doped GaN as the n-type contact layer 13 results in an n-type layer which has a higher carrier concentration and which establishes a preferable ohmic contact with the negative electrode 19, thus enabling to decrease a threshold current for the laser device. Although the thickness of the n-type contact layer 13 is not particularly limited, the thickness usually ranges from 0.1 to 5 μm.

The negative electrode formed on the surface of the n-type contact layer 13 that is exposed by etching is preferably formed of a metallic material such as Al, Ti, W, Cu, Zn, Sn or In and an alloy thereof. These metallic material may establish a preferable ohmic contact with the n-type contact layer 13.

The n-type carrier confinement layer 14 and the n-type light-guiding layer 15 formed on the layer 14 are each formed of an n-type nitride semiconductor. In the embodiment of FIG. 2, the n-type carrier confinement layer 14 is preferably formed of an aluminum-containing nitride semiconductor and more preferably of $Al_bGa_{1-b}N$ (0≦b≦1), while the n-type light-guiding layer 15 is preferably formed of an indium-containing n-type nitride semiconductor or an n-type GaN, i.e., $In_cGa_{1-c}N$ (0<c≦1). The preferred thickness of the n-type carrier confinement layer 14 usually ranges from 0.1 to 1 μm, while the preferred thickness of the n-type guiding layer 15 normally ranges from 100 angstroms to 1 μm.

The active layer 16 provided on the n-type light-guiding layer 15 has a quantum well structure (i.e., a single-quantum well (SQW) structure or a multi-quantum well (MQW) structure). The quantum well structure has a well layer or layers formed of an indium-containing nitride semiconductor, i.e., $In_dAl_eGa_{1-d-e}N$ (0<d≦1, 0≦e≦1, 0<d+e≦1) which has a band gap energy smaller than that of the n-type light-guiding layer 15 and than that of the first p-side nitride semiconductor layer 101. Preferably, the well layer is formed of a ternary mixed crystal $In_fG_{1-f}N$ (0<f<1). A ternary mixed crystal InGaN provides a layer having a better crystallinity and therefore enhanced light-emitting output power, relative to a quadripartite mixed crystal.

Particularly, it is preferred that the active layer 16 is of an MQW structure made by alternately laminating a well layer formed of InGaN and a barrier layer formed of a nitride semiconductor having a larger band gap energy than that of the well layer (the MQW structure has 3 layers at minimum). In the present invention, an MQW structure may be the one which has a well layer, as a lowermost layer of the structure, in contact with an n-type layer such as the n-type light-guiding layer 15, and has a well layer, as an uppermost layer of the structure, in contact with a p-type layer such as the first p-side layer 101, or may be the one which has a barrier layer, as a lowermost layer of the structure, in contact with an n-type layer such as the n-type light-guiding layer 15, and has a barrier layer, as an uppermost layer of the structure, in contact with a p-type layer such as the first p-side layer 101. The nitride semiconductor that forms the barrier layer includes GaN, AlGaN or the like. However, it is particularly preferred that the barrier layer be formed of a ternary mixed crystal $In_{f'}Ga_{1-f'}N$ (0<f'<1 providing f'<f) as in the case of the well layer. If the active layer 16 takes an MQW structure made by laminating InGaN layers having different band gap energy, a high-output power LD device can be realized which emits light of about 365 nm to 660 nm based on the emission between quantum levels by changing an indium mole fraction of the active layer, and/or by changing an aluminum mole fraction of the first or third n-side or p-side nitride semiconductor layer. Besides, the lamination, to the well layer, of an InGaN barrier layer which has a softer crystal than that of AlGaN and therefore can make a clad layer, e.g., AlGaN layer, that will be superimposed thereon, thicker and crack-free, makes it possible to realize an excellent laser oscillation.

In the case of an MQW structure, it is particularly desirable that the thickness of the well layer is not greater than 70 angstroms and the thickness of the barrier layer is not greater than 150 angstroms. Meanwhile, it is particularly desirable that the thickness of an active layer of a SQW structure formed by a single quantum-well layer is not greater than 70 angstroms. It is preferred that each of the well and barrier layers has a thickness of 5 angstroms or more.

The active layer 16 may be of a type that is not doped with an impurity or dopant (non-doped), or may be of a type which has the well layer and/or barrier layer doped with an impurity or dopant, i.e., an acceptor impurity and/or a donor impurity. Of the impurity-doped active layer, a silicon-doped one is particularly preferred. When Si is doped in the active layer, a threshold current tends to be lowered in an LD device. The doping of Si can be effected by adding an organosilicon gas such as tetraethylsilane, a silicon hydride gas such as silane and/or a silicon halide gas such as silicon tetrachloride to a raw material gas which grows a nitride semiconductor that forms the active layer.

The first p-side nitride semiconductor layer 101, which is provided to adjoin the active layer 16, is formed of a nitride semiconductor having a band gap energy larger than that of the active layer 16 (or more strictly, its well layer). Most preferably, the first nitride semiconductor layer is formed of an aluminum-containing nitride semiconductor, i.e., $In_gAl_hGa_{1-g-h}N$ ($0 \leq g \leq 1$, $0 < h \leq 1$, $0 < g+h \leq 1$) and is most preferably formed of a ternary mixed crystal $Al_jGa_{1-j}N$ ($0 < j < 1$). (In this specification, a nitride semiconductor represented by $Al_jGa_{1-j}N$ ($0 < j < 1$) or a similar expression is sometimes referred to simply as AlGaN.)

The first p-side nitride semiconductor layer 101 is preferably of i-type or p-type. By use of AlGaN in particular, it is easier to obtain a p-type having a high carrier concentration. In addition, by forming such an AlGaN layer to adjoin the active layer 16 comprising a well layer containing InGaN, it is possible to obtain a device having a high-level emission output power.

In the present invention, a p-type nitride semiconductor including the one forming the active layer 16 can be obtained by doping it with an acceptor impurity, such as Mg, Zn, C, Be, Ca or Ba, or a mixture thereof during a crystal growing process. Preferably the concentration of the acceptor impurity is $1 \times 10^{17}$ to $1 \times 10^{22}/cm^3$. When the acceptor impurity is magnesium, it is preferably doped at a concentration of $1 \times 10^{18}$ to $1 \times 10^{20}/cm^3$, and more preferably $1 \times 10^{19}$ to $1 \times 10^{20}/cm^3$. In any case, in order to obtain a p-type layer having a high-level carrier concentration, it is desirable to conduct an annealing treatment (heat treatment) at a temperature not lower than 400° C. in an inert gas environment after doping with an acceptor impurity. Normally, the annealing treatment makes it possible to obtain a carrier concentration of $1 \times 10^{17}$ to $1 \times 10^{19}/cm^3$ in the case of an Mg-doped p-type AlGaN. Meanwhile, the preparation of an i-type nitride semiconductor can be conducted, for example, by growing $Al_jGa_{1-j}N$, where j is not less than 0.5, without doping with an acceptor impurity. Alternatively, an i-type nitride semiconductor can be prepared by doping a p-type nitride semiconductor with a donor impurity in an amount that compensates the hole carrier concentration or by doping an n-type nitride semiconductor with an acceptor impurity in an amount that compensates the electron carrier concentration.

It is particularly preferred that the first p-side nitride semiconductor layer 101 be sufficiently thin so that the carriers (hole carriers) can tunnel through it. More specifically, it is preferred that the thickness of the first p-side nitride semiconductor layer 101 is not greater than 0.1 μm, preferably not greater than 0.05 μm (not greater than 500 angstroms) and most preferably not greater than 0.03 μm (not greater than 300 angstroms). If the thickness of the first nitride semiconductor layer 101 is in the above-mentioned range, the formation of crack in the first p-side nitride semiconductor layer 101 is prevented and a nitride semiconductor layer can be grown which has an excellent crystallinity. Besides, as the proportion of Al increases and as the thickness decreases in AlGaN, the laser oscillation thereof becomes easier. For example, when using $Al_jGa_{1-j}N$, where j is not less than 0.2, the thickness of the first p-side nitride semiconductor layer 101 is preferably not greater than 500 angstroms. Although no lower limit is set to the thickness of the first p-side nitride semiconductor layer 101, preferably the thickness is not less than 10 angstroms.

The second p-side nitride semiconductor layer 102 has a band gap energy smaller than that of the first p-side nitride semiconductor layer 101, but preferably larger than that of the active layer 16, and is provided at a location more distant from the active layer relative to the first p-side nitride semiconductor layer 101. Most preferably, the second p-side nitride semiconductor layer 102 is formed to adjoin the first p-side nitride semiconductor layer 101, as shown in FIG. 2. The second p-side nitride semiconductor layer 102 is formed preferably of $In_kGa_{1-k}N$ ($0 \leq k \leq 1$) and most preferably of GaN or InGaN. If the second p-side nitride semiconductor layer 102 is formed of GaN or InGaN, the resulting second p-side semiconductor layer 102 is almost crack-free and has an excellent crystallinity even when the layer is relatively thick. The thickness of the second p-side nitride semiconductor layer 102 is preferably in the range of 0.01 to 5 μm and most preferably in the range of 0.02 to 1 μm, which range enables the second p-side nitride semiconductor layer 102 to function, for example, as a desirable light-guiding layer. Besides, the second p-side nitride semiconductor layer 102 contains an acceptor impurity and is preferably of a p-type.

In addition, the second p-side nitride semiconductor layer 102, particularly the one formed of InGaN or GaN, functions also as a buffer layer which is useful for growing thereon the third p-side nitride semiconductor layer 103, as described hereinbelow. In comparison with AlGaN, InGaN or GaN is a softer crystal. Accordingly, by the presence of the second p-side nitride semiconductor layer 102, formed of InGaN or GaN, between the first p-side nitride semiconductor layer 101 having a band gap energy greater than that of the active layer 16 and the third p-side nitride semiconductor layer 103, it is possible to make the third p-side nitride semiconductor layer 103 crack-free and therefore thicker than the first p-side nitride semiconductor layer 101.

The third p-side nitride semiconductor layer 103 has a band gap energy larger than that of the second p-side nitride semiconductor layer 102 and is formed at a location more distant from the active layer relative to the second p-side nitride semiconductor layer 102. Most preferably, the third p-side nitride semiconductor layer 103 is formed to adjoin the second p-side nitride semiconductor layer 102, as shown in FIG. 2. The third p-side nitride semiconductor layer 103 is formed preferably of an aluminum-containing nitride semiconductor, i.e., $In_mAl_nGa_{1-m-n}N$ ($0 \leq m \leq 1$, $0 < n \leq 1$, $0 < m+n \leq 1$) and most preferably of an AlGaN ternary mixed crystal.

The third p-side nitride semiconductor layer 103 is required to have a band gap energy larger than that of the second p-side nitride semiconductor layer 102. This is because the third p-side nitride semiconductor layer 103 functions as a carrier confinement and light confinement layer. The thickness of the third p-side nitride semiconductor layer 103 is preferably in the range of 0.01 to 2 μm and most preferably in the range of 0.05 to 1 μm, which range enables the third p-side nitride semiconductor layer 103 to function as a carrier confinement layer having an excellent crystallinity. Besides, the third p-side nitride semiconductor layer 103 contains an acceptor impurity and is preferably of a p-type.

The p-type contact layer 17, provided on the third p-side nitride semiconductor layer 103, is formed of a p-type nitride semiconductor. Particularly, the use of InGaN or GaN, particularly Mg-doped p-type GaN, as the p-type contact layer 17, results in a p-type layer which has the highest carrier concentration and establishes a good ohmic contact with the positive electrode 20, thus enabling to decrease a threshold current.

The positive electrode 20 is preferably formed of a metallic material including a metal having a relatively high work function such as Ni, Pd, Ir, Rh, Pt, Ag or Au and an alloy thereof, in order to obtain an ohmic contact.

The current-restricting layer 18 is formed of an electrically insulating material and preferably of silicon dioxide. This current-restricting layer 18 may be omitted.

Meanwhile, in FIG. 2, the n-type carrier confinement layer 14 is provided on the n-type contact layer 13 through a crack preventing layer 30.

That is, an aluminum-containing nitride semiconductor tends to form cracks in the crystal when the crystal is grown to have a large thickness. Particularly, it is difficult to grow a thick layer of an n-type aluminum-containing nitride semiconductor directly on an n-type GaN or AlGaN layer without the formation of crack. For example, it is difficult to form an n-type layer, which is comprised of an aluminum-containing nitride semiconductor, particularly AlGaN, and which is exemplified by the n-type carrier confinement layer 14 requiring such a large thickness as 0.1 μm or more, on the n-type contact layer 13 formed, for example, of an n-type GaN or the like. Therefore, firstly an n-type layer, which is comprised of an indium-containing nitride semiconductor and preferably of $In_pGa_{1-p}N$ ($0<p\leq1$), is formed as a crack preventing layer 30 on the n-type contact layer 13, and then an n-type carrier confinement layer 14 is formed which is comprised of an n-type aluminum-containing nitride semiconductor. Owing to the presence of the crack preventing layer 30, the n-type carrier confinement layer 14 can be grown to a desired thickness (for example 0.1 μm or more). The thickness of the crack preventing layer 30 is preferably in the range of 100 angstroms to 0.5 μm.

Accordingly, the present invention provides a nitride semiconductor device including a first n-type layer which is formed of an n-type aluminum-containing nitride semiconductor or n-type gallium nitride, and a second n-type layer which is formed of an aluminum-containing n-type nitride semiconductor, wherein the device has a third n-type layer which is formed of an indium-containing n-type nitride semiconductor and which is provided between the first n-type layer and the second n-type layer. The third n-type layer may be present anywhere between the first n-type layer and the second n-type layer and does not need to adjoin any of the first n-type layer and the second n-type layer.

Figure 3:
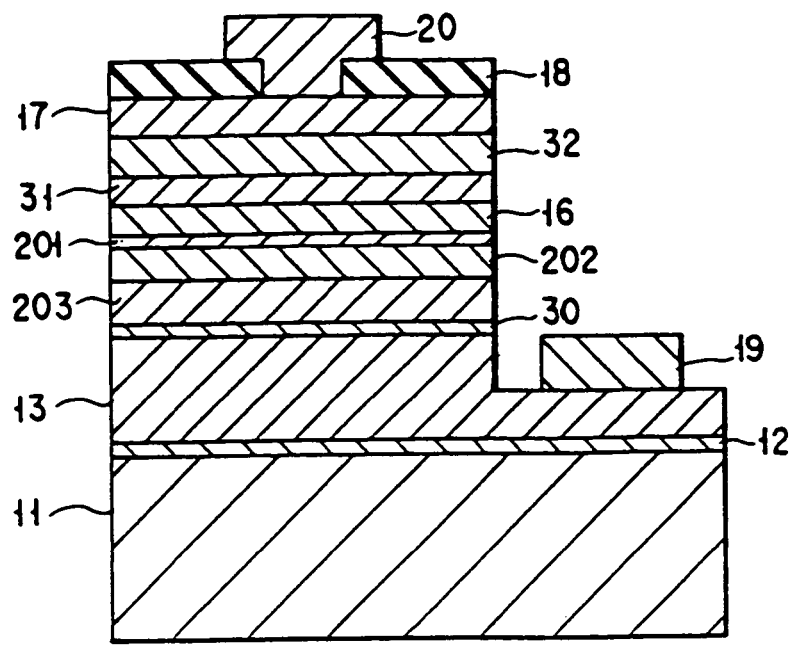
FIG. 3 is a sectional view schematically illustrating an LD device according to a second embodiment of the present invention.

FIG. 3 is a sectional view schematically illustrating a nitride semiconductor LD device according to a second embodiment of the present invention, where the same reference numerals indicates the same elements or members as in FIG. 2. With reference to FIG. 3, the LD device has a nitride semiconductor structure formed on the substrate 11 through the buffer layer 12. The structure includes the n-type contact layer 13, the crack preventing layer 30, a third n-side nitride semiconductor 203, a second n-side nitride semiconductor layer 202, a first n-side nitride semiconductor layer 201, the active layer 16, a p-type light-guiding layer 31, a p-type carrier confinement layer (light confinement layer) 32, the p-type contact layer 17 and the current-restricting layer 18. The negative electrode 19 is electrically connected to the n-type contact layer 13 and the positive electrode 20 is electrically connected to the p-type contact layer 17, as in FIG. 2.

In the LD device of FIG. 3, the first n-side nitride semiconductor layer 201, the second n-side nitride semiconductor layer 202 and the third n-side nitride semiconductor layer 203, with the exception of the type of electric conduction, are basically identical with the corresponding first p-side nitride semiconductor layer 101, second p-side nitride semiconductor layer 102 and third p-side nitride semiconductor layer 103, respectively, as explained with reference to FIG. 2 in terms of band gap energies, nitride semiconductor materials used and thickness, except for the conductivity type. In addition, what is mentioned of the preferred material, preferred thickness and the like about the first p-side nitride semiconductor layer 101, the second p-side nitride semiconductor layer 102 and the third p-side nitride semiconductor layer 103 is applicable to the first n-side nitride semiconductor layer 201, the second n-side nitride semiconductor layer 202 and the third n-side nitride semiconductor layer 203, respectively.

To reiterate briefly, the first n-side nitride semiconductor layer 201, provided to adjoin the active layer 16, is formed of a nitride semiconductor layer having a band gap energy larger than that of the active layer 16 (more strictly, its well layer). Most preferably, the first n-side nitride semiconductor layer 201 is formed of an aluminum-containing nitride semiconductor layer and especially preferably of an AlGaN ternary mixed crystal.

The first n-side nitride semiconductor layer 201 is also sufficiently thin so that the carriers (electron carriers) can tunnel through it. More specifically, the thickness of the first nitride semiconductor layer 201 is not greater than 0.1 μm, preferably not greater than 0.05 μm (not greater than 500 angstroms) and most preferably not greater than 0.03 μm (not greater than 300 angstroms). It is also preferred that the thickness of the first n-side nitride semiconductor layer 201 be not less than 10 angstroms.

The first n-side nitride semiconductor layer 201 is preferably of n-type or i-type.

In the present invention, although an n-type nitride semiconductor may be obtained without doping with an impurity, i.e., in a non-doped state, a desirable n-type can be obtained by doping with a donor impurity such as Si, Ge, Sn, S or a combination thereof during the growth of crystal. In this case, the concentration of the donor impurity is preferably $1\times10^{16}$ to $1\times10^{22}/cm^3$. In particular, Si is more preferably doped at a concentration of $1\times10^{17}$ to $1\times10^{21}/cm^3$, most preferably $1\times10^{18}$ to $1\times10^{20}/cm^3$.

The second n-side nitride semiconductor layer 202 has a band gap energy smaller than that of the first n-side nitride semiconductor layer 201, but preferably larger than that of the active layer 16, and is formed at a location more distant from the active layer relative to the first n-side nitride semiconductor layer 201. Most preferably, the second n-side nitride semiconductor layer 202 is provided to adjoin the first n-side nitride semiconductor layer 201, as shown in FIG. 3. The second n-side nitride semiconductor layer 202 is formed preferably of $In_kGa_{1-k}N$ ($0\leq k\leq1$) and most preferably of GaN or InGaN. The thickness of the second n-side nitride semiconductor layer 202 is preferably in the range of 0.01 to 5 μm and most preferably in the range of 0.02 to 1 μm, which range enables the second n-side nitride semiconductor layer 202 to function, for example, as a desirable light-guiding layer. The second n-side nitride semiconductor layer 202 is of an n-type. As is explained with reference to FIG. 2, the second p-side nitride semiconductor layer 102 functions as a buffer layer to cause the third p-side nitride semiconductor layer 103 to grow thereon as a relatively thick layer. Likewise, the second n-side nitride semiconductor layer 202 functions as a buffer layer to grow the first n-side nitride semiconductor layer 201, but the function as a buffer layer is not so important because the first n-side nitride semiconductor layer 201 is thin.

In order to function as a carrier confinement and light confinement layer, the third n-side nitride semiconductor 203 also has a band gap energy larger than that of the second n-side nitride semiconductor layer 202 and is formed at a location more distant from the active layer 16 relative to the second n-side nitride semiconductor layer 202. Most preferably, the third n-side nitride semiconductor layer 203 is formed to adjoin the second n-side nitride semiconductor layer 202, as shown in FIG. 3. The third n-side nitride semiconductor layer 203 is also formed preferably of an aluminum-containing nitride semiconductor and most preferably of an AlGaN ternary mixed crystal. The thickness of the third n-side nitride semiconductor layer 203 is also preferably in the range of 0.01 to 2 μm and most preferably in the range of 0.05 to 1 μm, which range enables the third n-side nitride semiconductor layer 203 to have an excellent crystallinity and to function as a carrier confinement and light confinement layer. The third n-side nitride semiconductor layer 203 is of an n-type. The third n-side nitride semiconductor layer 203, which is preferably comprised of an aluminum-containing nitride semiconductor, is formed on an n-type contact layer 13, which is preferably comprised of GaN, through the crack preventing layer 30.

The p-type light-guiding layer 31 and the p-type carrier confinement layer (light confinement layer) 32 are each formed of a p-type nitride semiconductor. The p-type carrier confinement layer (light confinement layer) 32 has a band gap energy larger than that of the p-type light-guiding layer 31 which has a band gap energy larger than that of the active layer 16.

Figure 4:
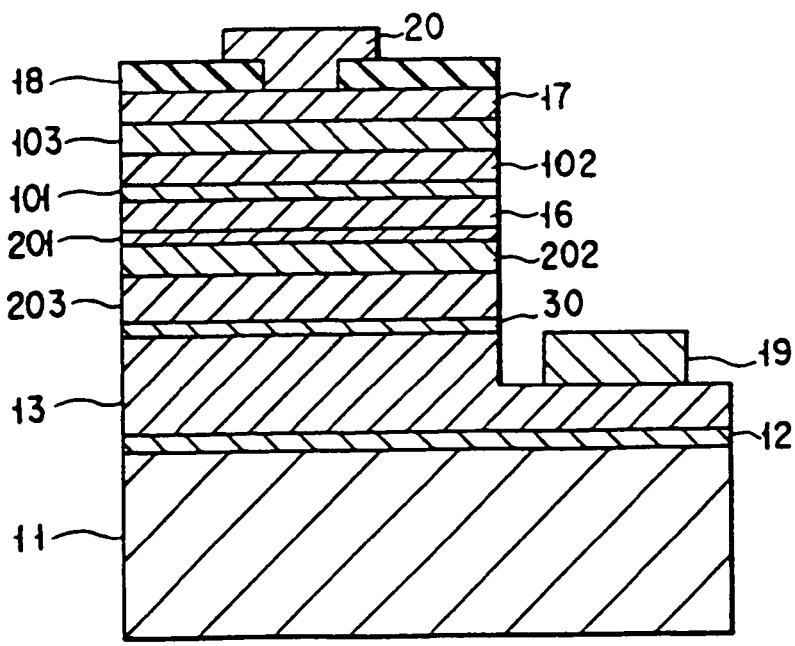
FIG. 4 is a sectional view schematically illustrating an LD device according to a third embodiment of the present invention.

FIG. 4 illustrates a nitride semiconductor LD device which has a three-layer laminate structure of the present invention on each of p-side and n-side of an active layer and which is presently the most preferred embodiment. Referring to FIG. 4, the LD device has a nitride semiconductor structure on the substrate 11 through a buffer layer 12. The structure includes the n-type contact layer 13, the crack preventing layer 30, the third n-side nitride semiconductor layer 203, the second n-side nitride semiconductor layer 202, the first n-side nitride semiconductor layer 201, the active layer 16, the first p-side nitride semiconductor layer 101, the second p-side nitride semiconductor layer 102, the third p-side nitride semiconductor layer 103 and the p-type contact layer 17. The current-restricting layer 18 with the contact hole 18a is provided on the p-type contact layer 17. The negative electrode 19 is provided on the exposed surface of the n-type contact layer 13, while the positive electrode 20 is provided on the current-restricting layer 18. The positive electrode 20 is connected to the p-type contact layer 17 through the contact hole 18a of the current-restricting layer 18. The elements constituting the device of FIG. 4 are identical with those explained with reference to FIGS. 2 and 3.

The nitride semiconductor layers constituting the device of the present invention can be preferably grown by means of a metalorganic vapor phase epitaxial growth (MOVPE) method. However, the nitride semiconductor layers can also be grown by conventional other methods including a hydride vapor phase epitaxial growth (HDVPE) method and a molecular beam vapor phase epitaxial growth (MBE) method.

FIG. 5 illustrates energy bands of an LD device shown in FIG. 4 in which the active layer has an MQW structure. As illustrated in FIG. 5, in the case of the LD device of a double-heterostructure of the present invention, the first p-side nitride semiconductor layer 101 and the first n-side nitride semiconductor layer 201 are provided to adjoin the active layer 16 which comprises an indium-containing nitride semiconductor. That is, the two first nitride semiconductor layers 101 and 201, each having a band gap energy larger than that of the active layer 16 (more strictly, its well layer) and also larger than that of the second n-side nitride semiconductor layer 102 and that of the second p-side nitride semiconductor layer 202, are provided to adjoin the active layer 16. Since these two first nitride semiconductor layers 101 and 201 are thin and therefore they have no function as a barrier against the carriers, the electron carriers, which are injected into the second n-side nitride semiconductor layer 202 from the third n-side nitride semiconductor layer 203, and the hole carriers, which are injected into the second p-side nitride semiconductor layer 102 from the third p-side nitride semiconductor layer 103, can tunnel through the first n-side nitride semiconductor layer 201 and the first p-side nitride semiconductor layer 101, respectively, and recombine efficiently at the active layer 16 to emit light (hυ).

Since the band gap energies of first nitride semiconductor layers 101 and 201 are sufficiently large, the injected carriers are blocked by the first nitride semiconductor layers 101 and 201 and do not overflow the active layer 16. As a result the electron and hole carriers are effectively accumulated in the active layer 16, thus enabling an efficient emission of light, even if the device temperature rises or the injection current density increases. Accordingly, the nitride semiconductor device of the present invention realizes an LD device characterized by little reduction of the light emission efficiency even in the case where the device temperature rises and also by a low threshold current (density).

The present inventors have made a close study on the active layer in the device of the present invention and particularly on the active layer having a well layer formed of a nitride semiconductor containing indium and gallium. As a result, they have found that, when growing, e.g., InGaN, the indium content does not becomes uniform throughout the grown InGaN layer depending on conditions, and, thus, indium-rich regions or phases and indium-poor regions or phases are formed. Electron and hole carriers are localized in the indium-rich regions thus formed to emit light based on exciton or bi-exciton. That is, the indium-rich regions constitute quantum dots or quantum boxes. In order for an InGaN well layer to form such quantum dots or quantum boxes, it has been found necessary that, as in the devices already explained with reference with FIGS. 2–4, the well layer be formed on an underlying nitride semiconductor layer such as n-type nitride semiconductor layer (aluminum-containing nitride semiconductor layer 15 or 201) in a state lattice-mismatched with the underlying layer and have a thickness not greater than 70 angstroms. Such a well layer can be conveniently provided by growing a well-forming nitride semiconductor layer on the n-type nitride semiconductor layer and allowing the grown layer to stand for a short period of time, preferably., 2 to 20 seconds before growing an additional nitride semiconductor layer thereon. The additional layer that is to be formed on the active layer having the well layer needs to contain an acceptor impurity. An LD device, which has the above-mentioned structure, has a threshold current lower than that of a usual quantum well structure laser and can have a higher characteristic temperature.

Accordingly, the present invention provides a nitride semiconductor device comprising a first clad layer comprising an n-type nitride semiconductor; an active layer of a quantum well structure (SQW or MQW structure) provided on the first clad layer, said active layer comprising a nitride semiconductor containing indium and gallium and having at least one well layer having a thickness not greater than 70 angstroms, wherein said well layer is placed on an underlying layer in a state lattice-mismatched with the underlying layer and includes a plurality of indium-rich regions and indium-poor regions; and a second clad layer which is provided on the active layer and comprises a nitride semiconductor doped with an acceptor impurity. The underlying layer refers to the first clad layer itself such as an n-type semiconductor layer, e.g., the aluminum-containing nitride semiconductor layer 15 or 201 as in the devices explained with reference to FIGS. 2 to 4, a barrier layer provided on the first clad layer, or a barrier layer on which a well layer is formed. FIG. 6 schematically or notionally illustrates such a device, in which the active layer has a SQW structure for the sake of brevity. As shown in FIG. 6, a quantum well layer (active layer) 54 provided to a thickness of 70 angstroms or less on a first clad layer comprising an n-type nitride semiconductor layer 52 in a state lattice-mismatched with the layer 52 is formed with InGaN in average, but constitutes indium-rich regions 54a and gallium-rich regions (indium-poor regions) 54b by phase separation as explained above. More specifically, the indium-rich regions 54a and the indium-poor regions each exist as dots or boxes which may have a size of 20 to 50 angstroms. Each indium-rich region 54a and each indium-poor region 54b are alternately arranged substantially regularly in the plane direction of the well layer. On the active layer 54, a second clad layer 56 formed of a nitride semiconductor doped with an acceptor impurity.

Naturally, it is preferable that the active layer having a well layer, which constitutes quantum dots or boxes, constitute the active layer 16 as explained with reference to FIGS. 2–4. The band gap energy of the phase-separated well layer is determined by an average semiconductor composition of such well layer, or the composition before the phase separation.

The threshold current can be further decreased, in the case where the active layer having a well layer or layers, which constitute quantum dots or boxes, are doped with an acceptor impurity and/or donor impurity.

The non-uniformity of the indium content in the plane of one well layer means that InGaN regions, which have different band gaps (i.e., indium-rich regions and indium-poor regions), exist in the plane direction of a single well layer. Therefore, the electrons, present in a conductive band, once drop into an indium-rich phase and recombine with holes, present in a valence electron band, to emit an energy of hυ. In other words, electron carriers and hole carriers are localized in an indium-rich phase of the well layer to form localized exciton, thus decreasing the threshold current of laser and increasing the light emission output of laser.

Where such a well layer is doped with a donor impurity and/or acceptor impurity, such as silicon, an additional energy level derived from impurity is formed between a conductive band and a valence electron band. Therefore, the electron carriers drop into a deeper impurity-induced energy level, while the hole carriers move to a p-type impurity-induced level to cause the recombination of the electron carriers and hole carriers, thus emitting a smaller energy of hυ. This leads us to believe that electron carriers and hole carriers are further localized to produce further localized exciton, which decreases the threshold current of the laser device. In the present invention, an impurity or dopant doped in the well layer preferably includes silicon and germanium, particularly silicon. In particular, when silicon is doped, the threshold current tends to be further lowered. Meanwhile, an impurity may be doped in a barrier layer, and in an active layer of an MQW structure, may be doped in one well layer only or in one barrier layer only.

The present invention is explained by way of examples below.

EXAMPLE 1

In this example, a nitride semiconductor LD device having a structure as illustrated in FIG. 4 was fabricated.

A sufficiently cleaned spinel substrate 11 ($MgAl_2O_4$) was placed in a reaction vessel of an MOVPE apparatus, and the gas inside the vessel was fully replaced with hydrogen. Then, under flowing hydrogen gas, the temperature of the substrate was raised to 1050° C. to carry out the cleaning of the substrate.

Then, the temperature was lowered to 510° C. and a GaN buffer layer 12 was grown to a thickness of about 200 angstroms on the substrate 11 by using hydrogen as a carrier gas and ammonia and trimethylgallium (TMG) as a raw material gas.

After the growth of the buffer layer, only TMG stream was stopped, and the temperature was raised to 1030° C. while flowing the ammonia gas. At 1030° C., TMG gas was added and, using silane gas ($SiH_4$) as a dopant gas, a Si-doped n-type GaN layer, as an n-type contact layer 13, was grown to a thickness of 4 μm.

Then, the temperature was lowered to 800° C. and a crack-preventing layer 30 comprised of Si-doped $In_{0.1}Ga_{0.9}N$ was grown to a thickness of 500 angstroms by using TMG, TMI (trimethylindium) and ammonia as a raw material gas and using silane gas as an impurity gas.

Then, the temperature was raised to 1030° C. and, using trimethylaluminum (TMA), TMG and ammonia as a raw material gas and using silane gas as a dopant gas, a Si-doped n-type $Al_{0.2}Ga_{0.8}N$ layer, as a third n-type contact layer 203, was grown to a thickness of 0.5 μm.

Then, the temperature was lowered to 800° C. and only TMA stream was stopped and a second n-type nitride semiconductor layer 202 comprised of Si-doped n-type GaN was grown to a thickness of 0.2 μm.

Then, the temperature was raised to 1050° C. and a first n-type nitride semiconductor layer 201 comprised of Si-doped $Al_{0.1}Ga_{0.9}N$ was grown to a thickness of 300 angstroms by using TMA, TMG and ammonia as a raw material gas and using silane gas as a dopant gas.

Then, using TMG, TMI and ammonia as a raw material gas, an active layer 16 was grown in the following way. The temperature was kept at 800° C. and a well layer comprised of non-doped $In_{0.2}Ga_{0.8}N$ was grown to a thickness of 25 angstroms. Then, by altering the TMI molar ratio, a barrier layer comprised of non-doped $In_{0.01}Ga_{0.99}N$ was grown to a thickness of 50 angstroms at the same temperature. This series of operation was repeated twice and such well layer were laminated to form an active layer having a 7-layered MQW structure.

Then, the temperature was raised to 1050° C. and a first p-type nitride semiconductor layer 101 comprised of Mg-doped p-type $Al_{0.1}Ga_{0.9}N$ was grown to a thickness of 300 angstroms by using TMG, TMA, ammonia and cyclopentadienyl magnesium ($Cp_2Mg$).

Then, at 1050° C. a second p-type nitride semiconductor layer 102 comprised of Mg-doped p-type GaN was grown to a thickness of 0.2 μm by using TMG, ammonia and $Cp_2Mg$.

Then, at 1050° C. a third p-type nitride semiconductor layer 103 comprised of Mg-doped p-type $Al_{0.2}Ga_{0.8}N$ was grown to a thickness of 0.5 μm by using TMG, TMA, ammonia and cyclopentadienyl magnesium ($Cp_2Mg$).

Finally, at 1050° C. a p-type contact layer 17 comprised of Mg-doped p-type GaN was grown to a thickness of 0.5 μm.

After the reactions, the temperature was lowered to room temperature, and the wafer was taken out of the reaction vessel. The wafer was annealed at 700° C. to further decrease the resistance of the p-type layer. Then, from the topmost p-type contact layer 17, etching was performed to expose the surface of the n-type contact layer 13 in a form of a stripe. After the etching process, a current-restricting layer 18 comprised of silicon dioxide was formed on the p-type contact layer 17 and a contact hole 18a was formed therein. Then, a positive electrode 20, comprised of Ni and Au, was formed in a shape of stripe so that it contacts with the p-type contact layer 17 through the contact hole 18a of the current-restricting layer 18. On the other hand, a negative electrode 19, comprised of Ti and Al, was formed in a shape of stripe.

Then, the wafer was cut to produce a bar in a direction vertical to the stripe-shaped electrode, and the cut surface was polished to produce a parallel mirror, which was laminated alternatively with $SiO_2$ and $TiO_2$ to form a dielectric multi-layered body. Finally, the bar was cut to produce a chip in a stripe form of 4 μm×600 μm in a direction parallel to the electrode and the chip was used as a laser chip. The chip, thus obtained, was set to a heat sink and laser oscillation was conducted at room temperature. The found laser oscillation was at a wavelength of 400 nm, with a threshold pulse current density of 2 $kA/cm^2$ and $T_0$ (characteristic temperature) of 200K under pulsed current flow (pulse width of 10 μsec, duty ratio of 10%)

Next, the device of the present invention was evaluated on the basis of the temperature dependence of the threshold current density. The threshold current density of LD, i.e., $J_{th}$, is proportional to $exp(T/T_0)$, where T is operating temperature (K) and $T_0$ is characteristic temperature (K). That is, the greater $T_0$ is, the lower the threshold current density even at a high temperature, thus leading to a stable operation.

In the device of Example 1, in the case where none of the first nitride semiconductor layers 101 and 201 was formed, no laser oscillation was observed. In the case where one of the first nitride semiconductor layers 101 and 201 was not formed, the LD device of the present invention exhibited $J_{th}$=3 $kA/cm^2$ and $T_0$=100 K. The LD device of Example 1 having the first nitride semiconductor layers 101 and 201 of $Al_jGa_{1-j}N$, where j is 0.1, gave $J_{th}$=2 $kA/cm^2$ and $T_0$=200K, as stated hereinbefore. However, the LD device of Example 1 having the first nitride semiconductor layers 101 and 201 of $Al_jGa_{1-j}N$, where j is 0.2, gave $J_{th}$=1.5 $kA/cm^2$ and $T_0$=300K, and the LD device of Example 1 having the first nitride semiconductor layers 101 and 201 of $Al_jGa_{1-j}N$, where j is 0.3, gave $J_{th}$=1.4 $kA/cm^2$ and $T_0$=400K, thereby indicating the excellent temperature characteristics of the LD devices of the present invention.

EXAMPLE 2

An LD device of the present invention was fabricated as in Example 1, except that the first n-side nitride semiconductor layer 201 was not grown. This LD device has the same structure as that of the LD device of FIG. 2 so that the n-type carrier confinement layer (light confinement layer) 14 corresponds to the third n-side nitride semiconductor 203, while the n-type light-guiding layer 15 corresponds to the second n-side nitride semiconductor 202. This LD device exhibited the laser oscillation of wavelength of 400 nm with $J_{th}$=3 $kA/cm^2$ and $T_0$=100K.

EXAMPLE 3

An LD device of the present invention was fabricated as in Example 1, except that the first p-side nitride semiconductor layer 101 was not grown. This LD device has the same structure as that of the LD device of FIG. 3 so that the p-type carrier confinement layer (light confinement layer) 32 corresponds to the third p-side nitride semiconductor 103, while the p-type light-guiding layer 31 corresponds to the second p-side nitride semiconductor 102. This LD device exhibited the laser oscillation of wavelength of 400 nm with $J_{th}$=3 $kA/cm^2$ as in the case of the LD of Example 2 and gave $T_0$=100K.

EXAMPLE 4

An LD device of the present invention was fabricated as in Example 2, except that the active layer 16 had a single quantum-well structure formed of a well layer comprised of non-doped $In_{0.2}Ga_{0.8}N$ having a thickness of 50 angstroms and the first p-type nitride semiconductor layer 101 was formed of $Al_{0.3}Ga_{0.7}N$. This LD device exhibited the laser oscillation of wavelength of 410 nm with $J_{th}$=5 $kA/cm^2$ and $T_0$=50K.

EXAMPLE 5

An LD device of the present invention was fabricated as in Example 1, except that the second n-type nitride semiconductor layer 202 was formed of Si-doped n-type $In_{0.01}Ga_{0.99}N$ and the second p-type nitride semiconductor layer 102 was formed of Mg-doped p-type $In_{0.01}Ga_{0.99}N$. This LD device exhibited the same properties as those of the LD device of Example 1.

EXAMPLE 6

An LD device of the present invention was fabricated as in Example 1, except that the well layer and barrier layer of the active layer were each doped with silicon, as a donor impurity, at a concentration of $1\times10^{19}/cm^3$. This device exhibited a threshold current lower by 5% and $T_0$ higher by about 10% relative to the LD device of Example 1.

EXAMPLE 7

An LD device of the present invention was fabricated as in Example 1, except that the well layer and barrier layer of the active layer were each doped with magnesium, as an acceptor impurity, at a concentration of $1\times10^{18}/cm^3$. This device exhibited properties nearly the same as those of the LD device of Example 1.

EXAMPLE 8

An LD device of the present invention was fabricated as in Example 1, except that the well layer and barrier layer of the active layer were each doped with silicon, as a donor impurity, at a concentration of $1\times10^{19}/cm^3$ and with magnesium, as an acceptor impurity, at a concentration of $1\times10^{18}/cm^3$. This LD device exhibited nearly the same properties as those of the LD device of Example 6.

EXAMPLE 9

In this Example, a nitride semiconductor LD device having a structure as shown in FIG. 2 was fabricated.

First, a fully washed sapphire substrate (0001 plane) 11 was set in a reaction chamber of a MOVPE apparatus. Using TMG and ammonia as a raw material gas, GaN was grown at 500° C. on the substrate to a thickness of 200 angstroms to form a buffer layer 12.

Then, the temperature was raised to 1050° C., and using TMG and ammonia as a raw material gas, and silane gas as an impurity gas, a Si-doped GaN was grown at that temperature to a thickness of 4 μm to form an n-type contact layer 13.

Thereafter, the temperature was lowered to 750° C., and using TMG, TMI and ammonia as a raw material gas, and silane gas as an impurity gas, an Si-doped $In_{0.1}Ga_{0.9}N$ was grown to a thickness of 500 angstrom to form a crack-preventing layer 30.

Then, the temperature was raised to 1050° C., and using triethylgallium (TEG), TMA and ammonia as a raw material gas, and silane as an impurity gas, an Si-doped n-type $Al_{0.3}Ga_{0.7}N$ was grown to a thickness of 0.5 μm to form an n-type carrier confinement layer 14.

Then, using TMG and ammonia as a raw material gas, and silane as an impurity gas, an Si-doped n-type GaN was grown to a thickness of 500 angstroms to form an n-type light-guiding layer 15.

Next, an active layer 16 was grown, using TMG, TMI and ammonia as a raw material gas. Specifically, the temperature was maintained at 750° C., and a non-doped $In_{0.2}Ga_{0.8}N$ was grown on the light-guiding layer 15 to a thickness of 25 angstroms to form a well layer. Then, a non-doped $In_{0.1}Ga_{0.9}N$ was grown on the well layer to a thickness of 50 angstroms to form a barrier layer at the same temperature by changing the flow rate of the TMI stream. These procedures of forming the well and barrier layers alternately were repeated 13 times in total, and finally such well layer was grown, thus forming an active layer 16 of an MQW structure having a total thickness of 0.1 μm.

After the formation of the active layer 16, the temperature was raised to 1050° C., and using TMG, TMA, ammonia as a raw material gas, and $Cp_2Mg$ as a dopant gas, an Mg-doped $Al_{0.2}Ga_{0.8}N$ was grown to a thickness of 100 angstroms to form a first p-type nitride semiconductor layer 101.

Then, while maintaining the temperature at 1050° C., an Mg-doped p-type GaN was grown to a thickness of 500 angstroms to form a second p-type nitride semiconductor layer 102, using TMG and ammonia as a raw material gas, and $Cp_2Mg$ as a dopant gas.

Next, a third p-type nitride semiconductor layer 103 was formed by growing an Mg-doped $Al_{0.3}Ga_{0.7}N$ to a thickness of 0.5 μm, using TMG, TMA and ammonia as a raw material gas, and $Cp_2Mg$ as a dopant gas.

Subsequently, a p-type contact layer 17 was form by growing an Mg-doped p-type GaN to a thickness of 0.5 μm, using TMG, ammonia as a raw material gas, and $Cp_2Mg$ as a dopant gas.

After the reactions, the temperature was lowered to room temperature, and the wafer was taken out of the reaction vessel. Then, from the topmost p-type contact layer 17, etching was performed to expose the surface of the n-type contact layer 13. Then, a positive electrode 20, comprised of Ni and Au, was formed in a shape of stripe, while a negative electrode 19, comprised of Ti and Al, was formed in a shape of stripe. The wafer thus processed was vertically etched in a direction normal to the longitudinal direction of the stripe electrodes 19 and 20 to form vertical etched surfaces, on which reflecting mirrors were formed to prepare resonance planes, thus providing an LD device. The device was set to a heat sink and laser oscillation was conducted at room temperature. The found laser oscillation was at a wavelength of 410 nm with a half bandwidth of 0.2 nm, and the threshold current density was 2 $kA/cm^2$.

EXAMPLE 10

An LD device was fabricated in the same manner as in Example 9, except that the third p-type nitride semiconductor 103 was formed to a thickness of 0.1 μm. This device exhibited a laser oscillation at a wavelength of 410 nm with a half bandwidth of 0.2 nm at room temperature, and the threshold current density was 4.0 $kA/cm^2$.

EXAMPLE 11

The same procedures were followed as in Example 9, except that the crack-preventing layer 30 was formed to a thickens of 200 angstroms, and that a further n-type contact layer comprised of Si-doped GaN was formed to a thickness of 0.5 μm on that crack-preventing layer before forming the first n-type clad layer 14. The LD device thus fabricated exhibited a laser oscillation at 410 nm with a half bandwidth of 0.2 nm at room temperature, and the threshold current density was 4.0 $kA/cm^2$.

EXAMPLE 12

The same procedures were followed as in Example 9, except that the second clad layer 14 was formed by growing Si-doped n-type $In_{0.05}Ga_{0.95}N$ to a thickness of 500 angstroms, using TMG, TMI and ammonia as a raw material gas, and silane as a dopant gas, and that the second p-type nitride semiconductor layer 102 was formed by growing Mg-doped p-type $In_{0.01}Ga_{0.99}N$ to a thickness of 500 angstroms, using TMG, TMI and ammonia as a raw material gas, and $Cp_2Mg$ as a dopant gas. The LD device thus fabricated exhibited a laser oscillation at 410 nm with a half bandwidth of 0.2 nm at room temperature, and the threshold current density was 4.0 $kA/cm^2$.

EXAMPLE 13

The same procedures were followed as in Example 9, except that spinel ((111)-plane) was used as the substrate 11. The obtained wafer was processed as in Example 1, thereby obtaining an LD device. The LD device thus fabricated exhibited a laser oscillation at 410 nm with a half bandwidth of 0.2 nm at room temperature, and the threshold current density was 4.0 $kA/cm^2$.

EXAMPLE 14

The same procedures were followed as in Example 1, except that after each well layer of $In_{0.2}Ga_{0.8}N$ (average composition) was formed, the well was allowed to stand for 5 seconds and then each barrier layer was formed, thus obtaining an LD device. In this device, it was found that each wall layer was phase-separated into indium-rich regions and indium-poor regions, and each indium-rich region almost corresponded to a composition of $In_{0.4}Ga_{0.6}N$ and each indium-poor region almost corresponded to a composition of $In_{0.02}Ga_{0.98}N$. Further, it was confirmed by TEM sectional photograph that the indium-rich regions and the indium-poor regions were alternately arranged regularly in the plane direction of the well layer (refer to FIG. 6). The LD device thus fabricated exhibited a threshold current density lower than that of the device fabricated in Example 1 by 30%, and a $T_0$ higher than that of the device fabricated in Example 1 by 20%.

EXAMPLE 15

The same procedures were followed as in Example 14, except that silicon was doped in each well layer, thus fabricating an LD device. This device exhibited a threshold current density lower than that of the device fabricated in Example 1 by 40%, and a $T_0$ higher than that of the device fabricated in Example 1 by 30%.

Meanwhile, in each Example described above, an impurity whose concentration was not particularly indicated was doped in a preferred concentration range explained above.

The above-described examples show the most preferred examples, where the active layer, the first nitride semiconductor layer, the second nitride semiconductor layer and the third nitride semiconductor layer are brought into contact. However, according to the present invention, at least the first nitride semiconductor layer needs to contact the active layer, and, therefore, other nitride semiconductor layer can be inserted between the first nitride semiconductor layer and the second nitride semiconductor or between the second nitride semiconductor layer and the third nitride semiconductor layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nitride semiconductor device comprising:
   an active layer of a quantum well structure which has a first surface and a second surface and which comprises an indium-containing nitride semiconductor;
   a first layer which adjoins the first surface of the active layer and has a band gap energy larger than that of the active layer;
   a second layer which is a light layer and is formed on the first surface side of the active layer at a location more distant from the active layer relative to the first layer and which comprises a nitride semiconductor containing an acceptor impurity and which has a band gap energy smaller than that of the first layer; and
   a third layer which is formed on the first surface side of the active layer at a location more distant from the active layer relative to the second layer and which comprises a nitride semiconductor containing an acceptor impurity and which has a band gap energy larger than that of the second layer.

2. The device according to claim 1, wherein said first layer has a thickness sufficiently thin such that carriers may tunnel therethrough.

3. The device according to claim 1, wherein said first layer has a thickness of 0.1 μm or less.

4. The device according to claim 3, wherein said first layer has a thickness of 10 angstroms or more.

5. The device according to claim 1, wherein said active layer is doped with an impurity.

6. The device according to claim 5, wherein said impurity comprises silicon or germanium.

7. The device according to claim 5, wherein said impurity is doped in at least one well layer in said active layer.

8. The device according to claim 1, wherein said second layer adjoins said first layer.

9. The device according to claim 8, wherein said third layer adjoins said second layer.

* * * * *

UNITED STATES PATENT AND TRADEMARK OFFICE
CERTIFICATE OF CORRECTION

PATENT NO. : 7,166,869 B2 Page 1 of 1
APPLICATION NO. : 10/801038
DATED : January 23, 2007
INVENTOR(S) : Nakamura et al.

It is certified that error appears in the above-identified patent and that said Letters Patent is hereby corrected as shown below:

Column 20, line 14,

"light layer" should be --light guiding layer--.

Signed and Sealed this

Eleventh Day of March, 2008

JON W. DUDAS
*Director of the United States Patent and Trademark Office*